United States Patent
Xie et al.

(10) Patent No.: US 12,224,181 B2
(45) Date of Patent: Feb. 11, 2025

(54) LASER-CUT LEAD-FRAME FOR INTEGRATED CIRCUIT (IC) PACKAGES

(71) Applicant: TEXAS INSTRUMENTS INCORPORATED, Dallas, TX (US)

(72) Inventors: Tiange Xie, Si Chuan (CN); Li Xiang Zheng, Si Chuan (CN); Alex Chin Sern Ting, Johor (MY); Zhenzhen He, Si Chuan (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 494 days.

(21) Appl. No.: 17/458,653

(22) Filed: Aug. 27, 2021

(65) Prior Publication Data

US 2023/0063278 A1    Mar. 2, 2023

(51) Int. Cl.
*H01L 21/48* (2006.01)
*H01L 23/00* (2006.01)
*H01L 23/495* (2006.01)

(52) U.S. Cl.
CPC .... *H01L 21/4842* (2013.01); *H01L 23/49541* (2013.01); *H01L 24/48* (2013.01); *H01L 24/85* (2013.01); *H01L 24/96* (2013.01); *H01L 24/97* (2013.01); *H01L 2224/48245* (2013.01); *H01L 2224/80001* (2013.01)

(58) Field of Classification Search
CPC ............. H01L 21/4842; H01L 21/4821; H01L 23/49541; H01L 23/49548; H01L 24/48; H01L 24/85; H01L 24/96; H01L 24/97
See application file for complete search history.

(56) References Cited

U.S. PATENT DOCUMENTS

| | | | |
|---|---|---|---|
| 2007/0161157 A1* | 7/2007 | Islam | H01L 24/48 438/120 |
| 2008/0258278 A1* | 10/2008 | Ramos | H01L 21/4832 257/676 |

* cited by examiner

*Primary Examiner* — Marc Anthony Armand
(74) *Attorney, Agent, or Firm* — Ronald O. Neerings; Frank D. Cimino

(57) ABSTRACT

One example described herein includes a method for fabricating integrated circuit (IC) packages. The method includes fabricating a plurality of IC dies and providing a conductive metal material sheet. The method also includes laser-cutting the conductive metal material sheet to form a lead-frame sheet. The lead-frame sheet includes at least one of through-holes and three-dimensional locking features. The method further includes coupling the IC dies to the lead-frame sheet and coupling the lead-frame sheet and the IC dies to packaging material to form an IC package block comprising the IC packages.

20 Claims, 6 Drawing Sheets

LASER-CUT LEAD-FRAME FOR INTEGRATED CIRCUIT (IC) PACKAGES

TECHNICAL FIELD

This description relates generally to electronic circuits, and more particularly to a laser-cut lead-frame for integrated circuit (IC) packages.

BACKGROUND

Integrated circuits (ICs) form the basis for modern computing, in which IC dies are fabricated based on etching and layering different materials. The IC dies are combined with conductive metal that forms ground pads and leads and are packaged in packaging material to form IC packages. The conductive metal for a set of semiconductor dies that correspond to multiple IC dies can be formed from a lead-frame sheet. Typically, a lead-frame sheet is etched in a similar manner as a semiconductor wafer to form the divisions and separations that can facilitate coupling of the ground pads and leads to the respective IC dies. The etching process typically involves deposition of chemicals that dissolve portions of the conductive metal to form holes that result in the divisions and separations that allow for the entire lead-frame sheet to be coupled to the semiconductor dies and for the semiconductor dies and lead-frame sheet to be coupled to the packaging material to form a block of IC packages. The IC packages in the IC package block are thus mechanically separated (e.g., by a sawing process) to singulate the IC packages in a typical fabrication process.

SUMMARY

One example described herein includes a method for fabricating integrated circuit (IC) packages. The method includes fabricating a plurality of IC dies and providing a conductive metal material sheet. The method also includes laser-cutting the conductive metal material sheet to form a lead-frame sheet. The lead-frame sheet includes at least one of through-holes and three-dimensional locking features. The method further includes coupling the IC dies to the lead-frame sheet and coupling the lead-frame sheet and the IC dies to packaging material to form an IC package block comprising the IC packages.

Another example described herein includes a method for fabricating integrated circuit (IC) packages. The method includes fabricating a plurality of IC dies and providing a conductive metal material sheet. The method also includes forming a lead-frame sheet from the conductive metal material sheet and coupling the IC dies to the lead-frame sheet. The method also includes coupling the lead-frame sheet and the IC dies to packaging material to form an IC package block comprising the IC packages. The method further includes laser-cutting at least one groove in the packaging material and a respective lead-frame of each of the IC packages to electrically isolate portions of lead-frame from each other.

Another example described herein includes an integrated circuit (IC) package. The package includes an IC and a ground pad formed from a laser-cut lead-frame sheet. The laser-cut lead-frame sheet can be formed from laser-cutting a conductive metal material sheet to form at least one of through-holes and three-dimensional locking features. The package also includes a plurality of leads formed from the laser-cut lead-frame sheet. The package further includes packaging material that substantially surrounds the IC and a portion of each of the ground pad and the plurality of leads.

DETAILED DESCRIPTION

This description relates generally to electronic circuits, and more particularly to a laser-cut lead-frame sheet for integrated circuit (IC) packages. As described herein, the lead-frame sheet that is formed from a conductive metal material sheet is laser-cut (e.g., via a laser graphic process) instead of etched. For example, the lead-frame sheet can be laser-cut to include all of the features of a lead-frame sheet that is typically etched, such as including through-holes, three-dimensional locking features for mating with corresponding holes in packaging material of an IC package (e.g., a quad flat no-lead (QFN) IC package). As another example, the lead-frame sheet can also include additional features associated with lead-frame sheets, such as an index through-hole, a mold-flow vent feature, and a stress-release feature. The lead-frame sheet can thus be fabricated with a laser-cutting process on a conductive metal material sheet to include all of the features of a typical etched lead-frame sheet.

IC dies can be coupled to the lead-frame sheet and to the packaging material to form an IC package block. The IC package block can thus include a plurality of IC packages that are conjoined by the packaging material and the lead-frame sheet. The IC packages can thus be singulated based on laser-cutting the IC package block, as opposed to a typical fabrication process in which the IC package block is mechanically cut (e.g., with a saw or other cutting tool). Such mechanical cutting for a typical fabrication procedure is provided along a tie-bar, which is typically required for an etched lead-frame sheet. However, laser-cutting the lead-frame sheet can obviate the need for tie-bars and cross-bars in the lead-frame sheet, thus facilitating a simpler arrangement for the lead-frame sheet and a cleaner singulation of the IC packages from the IC package block. Furthermore, one or more grooves can be laser-cut in the packaging material and the lead-frame sheet of each of the IC packages (e.g., a bottom surface of the IC packages) to electrically isolate portions of the lead-frame sheet from each other. For example, the groove(s) can isolate a plurality of leads from the ground pad in each of the IC packages. As described herein, the term "leads" can refer to signal pads, such as in the example of the IC packages being arranged as QFN IC packages.

Figure 1:
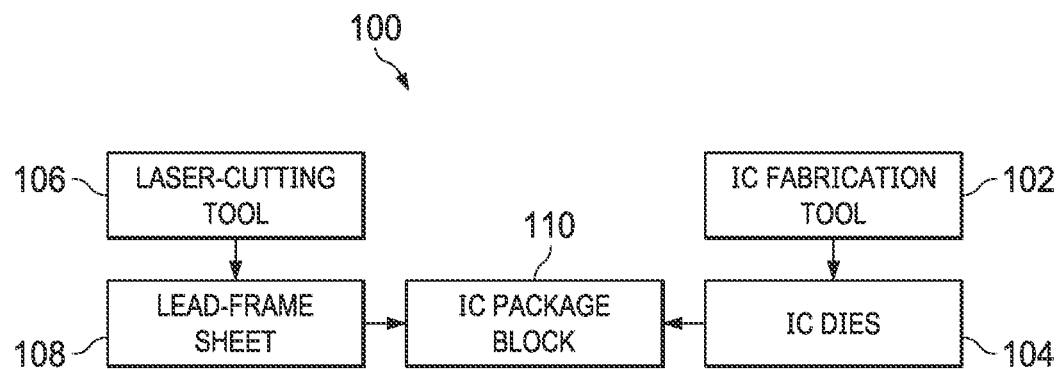
FIG. 1 is an example of a block diagram of a process for fabricating IC packages.

FIG. 1 is an example of a block diagram 100 of a process for fabricating integrated circuit (IC) packages. The diagram 100 can correspond to a simplistic example of fabrication of any of a variety of different types of IC packages. As an example, the IC packages can be fabricated as quad flat no-lead (QFN) IC packages.

The diagram 100 includes an IC fabrication tool 102 that is configured to fabricate a plurality of IC dies 104, such as on a semiconductor wafer. For example, the IC fabrication tool 102 can be configured to provide material deposition, chemical etching, and a variety of other IC fabrication processes to fabricate the IC dies 104 on the semiconductor wafer. As an example, the semiconductor wafer can include a substrate (e.g., formed from any of a variety of substrate materials) on which the IC dies 104 are fabricated.

The diagram 100 also includes a laser-cutting tool 106 that is configured to laser-cut a lead-frame sheet 108. The laser-cutting tool 106 can correspond to any of a variety of graphical lasers that provide sufficient power to cut through the materials of an IC package (e.g., silicon, metal, plastic, etc.), as described in greater detail herein. For example, the lead-frame sheet 108 can be formed from a conductive metal material sheet (e.g., a copper sheet), such that the laser-cutting tool 106 cuts predetermined shapes into the conductive metal material sheet to form the lead-frame sheet 108. As an example, the laser-cutting tool 106 can cut at least one through-holes and three-dimensional locking features into the conductive metal material sheet to form the lead-frame sheet 108. As another example, the laser-cutting tool 106 can also cut additional features associated with a traditional lead-frame sheet into the conductive metal material sheet to form the lead-frame sheet 108, such as an index through-hole, a mold-flow vent feature, and a stress-release feature.

In the example of FIG. 1, the lead-frame sheet 108 is combined with the IC dies 104, previously singulated from a semiconductor wafer (e.g., via the laser-cutting tool 106 or another cutting tool), to form an IC package block 110. As an example, the IC package block 110 can also include packaging material (not shown), such as a plastic molding material, that can substantially surround the singulated IC dies 104 and can surround portions of the lead-frame sheet 108 to form IC package block 110. Therefore, the IC package block 110 can correspond to a group of IC packages that are conjoined by the lead-frame sheet 108 and the packaging material. As described in greater detail herein, the lead-frame sheet 108 thus provides multiple lead-frames that each include at least one ground pad and a plurality of leads for each of the IC packages in the IC package block 110.

As described herein, implementing laser-cutting to form the lead-frame sheet 108 provides for a significantly more efficient and cost-effective manner of fabricating the lead-frame sheet 108, and by extension the IC package block 110, than a typical manner of fabricating a lead-frame sheet. Typical lead-frame sheets are fabricated based on an etching (e.g., chemical etching) process. Chemical etching can result in a much less precise shaping of the through-holes and/or three-dimensional locking features of the lead-frame sheet than implementing an indexed laser to cut the same features in the lead-frame sheet 108. Additionally, etching a lead-frame sheet can limit a minimum size of a given IC and a given input/output (I/O) count, for a given lead-frame of the lead-frame sheet 108, based on imprecise etching tolerance and a minimum etching space, thereby limiting meeting the demand for miniaturization of IC packages. Additionally, etching lead-frame sheets can be significantly more expensive than laser-cutting the lead-frame sheet 108. For example, the etching process can be more costly and can take a significantly longer time to complete than programming the laser-cutting tool 106. Furthermore, many fabrication facilities outsource lead-frame sheet etching, and may require a minimum order quantity and/or large stocking quantities. Such a fabrication system can provide significant delays, particularly in the event of etching errors or changes to the fabrication of the IC packages. However, by implementing an in-house laser-cutting tool 106, such delays and costs can be greatly mitigated. For these reasons, laser-cutting the lead-frame sheet 108 via the laser-cutting tool 106 can provide for a significantly more efficient fabrication process than etching a lead-frame sheet.

Figure 2:
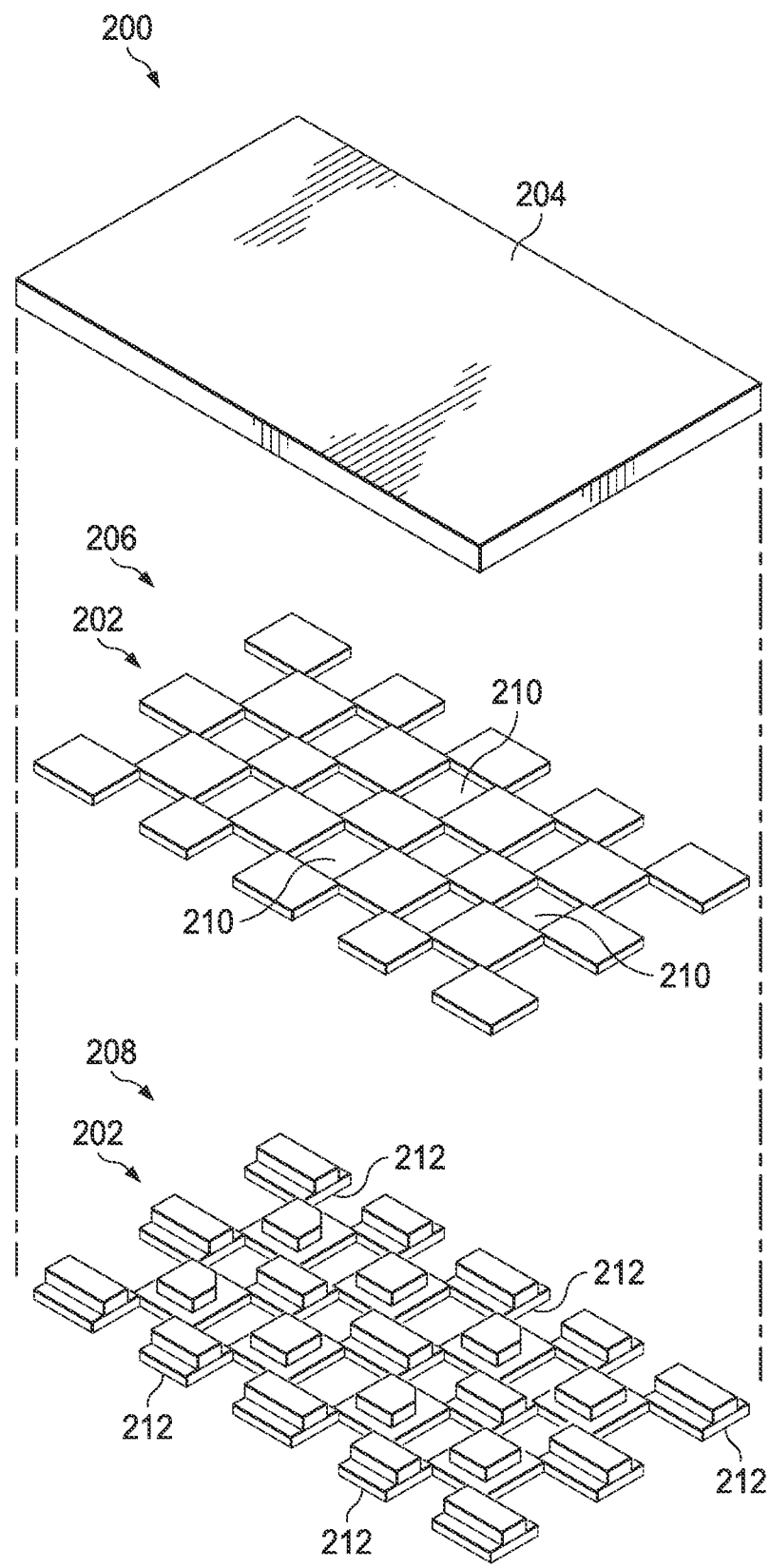
FIG. 2 is an example diagram of a laser-cut lead-frame sheet.

FIG. 2 is an example diagram 200 of a laser-cut lead-frame sheet 202. The diagram 200 demonstrates a conductive metal material sheet 204 that can correspond to a thin sheet of conductive metal from which the laser-cut lead-frame sheet 202 is formed. As an example, the conductive metal material sheet 204 can be a thin sheet of copper or other conductive metal that can be cut and shaped via a laser (e.g., the laser-cutting tool 106). The diagram 200 also demonstrates the laser-cut lead-frame sheet 202 in a top view 206 and in a bottom view 208. The laser-cut lead-frame sheet 202 is demonstrated as including through-holes 210, visible in both the top and bottom views 206 and 208, which are formed from laser-cutting through the conductive metal material sheet 204.

The laser-cut lead-frame sheet 202 also includes three-dimensional locking features 212, visible in the bottom view 208. In the example of FIG. 2, the three-dimensional locking features 212 are demonstrated as partial removal of the thickness of the conductive metal material sheet 204, such that the three-dimensional locking features 212 include thinner portions of the conductive metal material sheet 204. The three-dimensional locking features 212 can facilitate coupling of the laser-cut lead-frame sheet 202 with packaging material, such that a portion of the laser-cut lead-frame sheet 202 in a resulting IC package can be exposed while the remainder of the laser-cut lead-frame sheet 202 can be surrounded by and held in place by the packaging material. Therefore, as described in greater detail herein, the laser-cut lead-frame sheet 202 can form lead-frames that include ground pads and leads of the resultant IC packages. Furthermore, the laser-cut lead-frame sheet 202 can include additional features that are formed by the laser-cutting tool 106, such as index through-holes, mold-flow vent features, and/or stress-release features.

Figure 3:
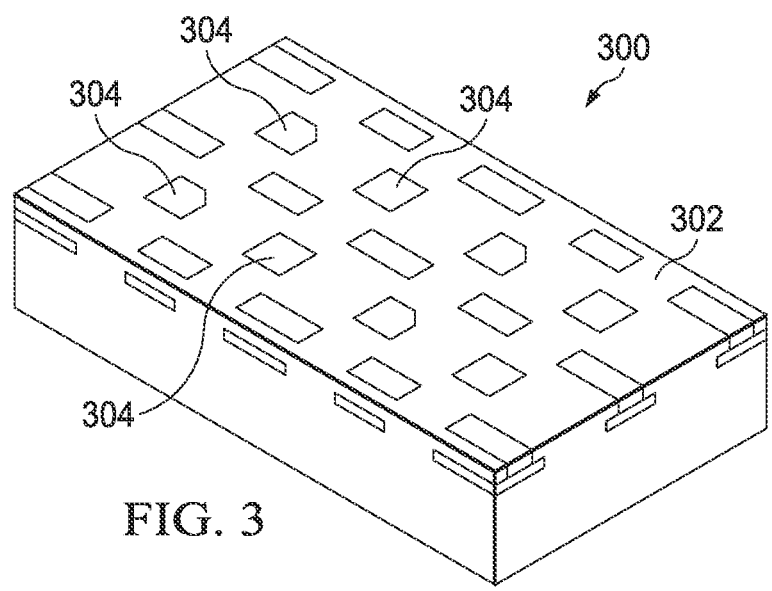
FIG. 3 is an example of an IC package block.

As an example, the packaging material can be formed by a plastic molding material that is flowed onto the combined laser-cut lead-frame sheet 202 and respective IC dies (e.g., via an injection molding process), followed by a post-mold cure (PMC) process. FIG. 3 is an example of an IC package block 300. The IC package block 300 is demonstrated as a combination of the laser-cut lead-frame sheet 202 in the diagram 200 of the example of FIG. 2 and packaging material 302 (as well as the IC dies, not shown in the example of FIG. 3). The IC package block 300 therefore includes a plurality of IC packages that are conjoined by the laser-cut lead-frame sheet 202 and the packaging material 302. In the example of FIG. 3, portions of the laser-cut lead-frame sheet 202 are exposed on the surface of the IC package block 300. Thus, the exposed portions, demonstrated at 304, can correspond to respective lead-frames (e.g., including ground pads and leads) of the resultant IC packages.

Figure 4:
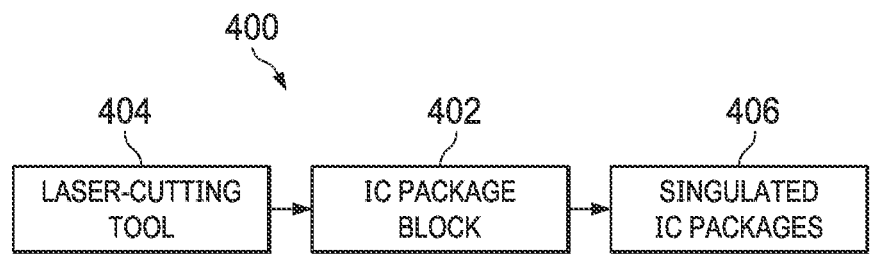
FIG. 4 is another example of a block diagram of a process for fabricating IC packages.

FIG. 4 is another example of a block diagram 400 of a process for fabricating IC packages. The diagram 400 can correspond to a simplistic example of fabrication of any of a variety of different types of IC packages. As an example, the diagram 400 can correspond to a portion of the fabrication process subsequent to the formation of the IC package block, demonstrated in the example of FIG. 4 at 402.

The diagram 400 also includes a laser-cutting tool 404. As an example, the laser-cutting tool 404 can correspond to the same laser-cutting tool 106 demonstrated in the example of FIG. 1. Therefore, as described in greater detail herein, the laser-cutting tool 404 can be used for multiple stages and functions during the fabrication of the IC packages. In the example of FIG. 4, the laser-cutting tool 404 is provided to the IC package block 402 to cut around each of the IC packages that are conjoined together on the IC package block 402. As a result, the laser-cutting tool 404 can singulate the IC packages as discrete IC packages relative to each other, thus providing singulated IC packages 406. Therefore, as opposed to implementing a mechanical separation of the IC packages, as is provided in a typical fabrication process, the laser-cutting tool 404 can laser-cut the IC package block 402 to provide the singulated IC packages 406. In addition, as described in greater detail herein, the laser-cutting tool 404 can cut one or more grooves into each of the IC packages (e.g., before or after singulation) to electrically isolate portions of the laser-cut lead-frame sheet 202. Therefore, the groove(s) can form the ground pads and the leads of each of the IC packages from the laser-cut lead-frame sheet 202.

Figure 5:
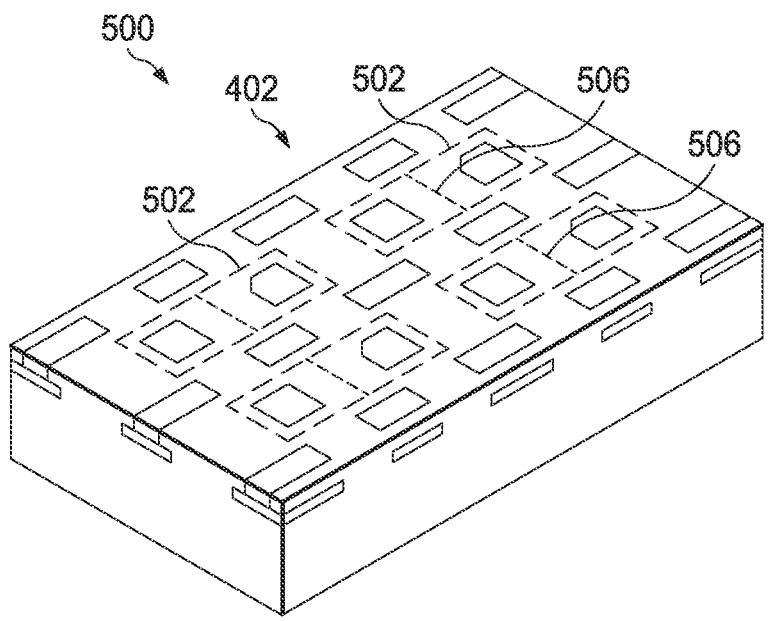
FIG. 5 is an example of singulated IC packages.
Figure 5:
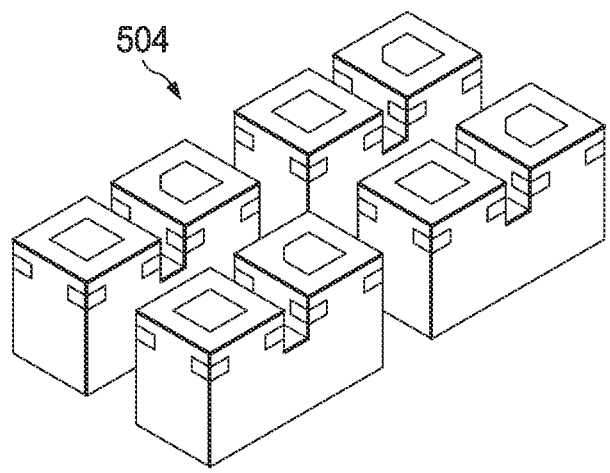

FIG. 5 is an example diagram 500 of singulated IC packages. The diagram 500 includes the IC package block 402 in the example of FIG. 4. In the example of FIG. 5, the IC package block 402 is marked with dashed lines 502 to demonstrate the borders of IC packages, demonstrated at 504. As an example, the laser-cutting tool 404 can cut along the dashed lines 502 to singulate the IC chips in the IC package block 402 to provide the IC packages 504. Additionally, the IC package block 402 is marked with dotted lines 506 that can correspond to a location of a groove that the laser-cutting tool 404 can cut into each of the IC packages 504. The groove can correspond to a partial cut through the IC package block 402, as opposed to a through-cut that is implemented for the singulation of the IC packages 504. The groove along the dotted line 506 can thus be sufficient to cut through a portion of the lead-frame sheet 202 to electrically isolate portions of the lead-frame of the resultant IC packages 504, thereby providing electrical isolation between leads a ground pad for each of the IC packages 504.

Figure 6:
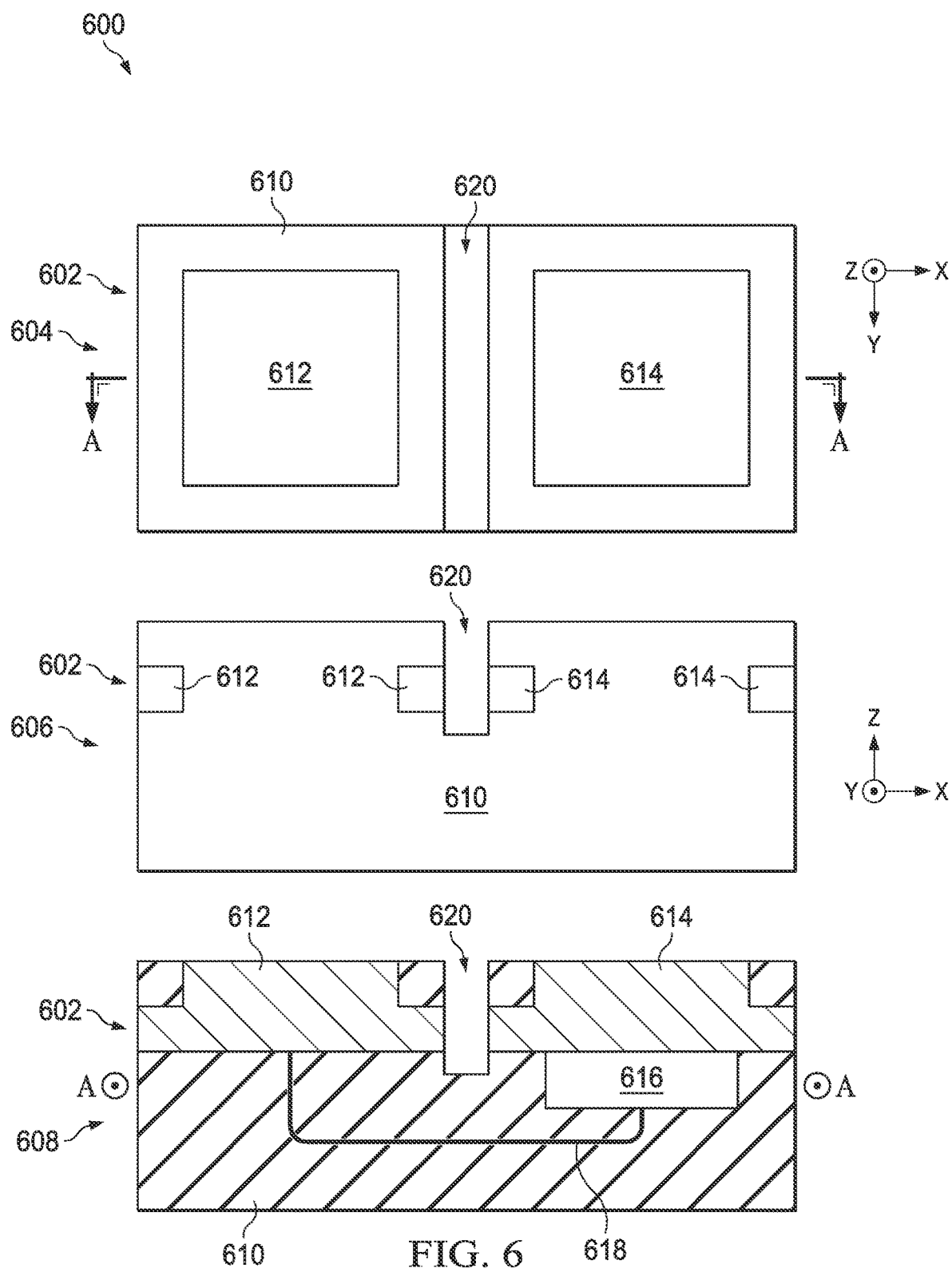
FIG. 6 is an example diagram of an IC package.

FIG. 6 is an example diagram 600 of an IC package 602. The diagram 600 demonstrates three views of the IC package 602, including a first view 604 along an XY-plane of the IC package 602, a second view 606 along an XZ-plane of the IC package 602, and a third view 608 of the IC package 602 corresponding to a cross-sectional view taken along "A" in the first view 604. The IC package 602 can correspond to one of the IC packages 504 in the example of FIG. 5. Therefore, the IC package 602 can be formed from singulating the IC packages 504 in the IC package block 402 via the laser-cutting tool 404. As an example, the IC package 602 corresponds to a QFN IC package, with the first view 604 corresponding to a view of the bottom of the IC package 602.

The IC package 602 includes packaging material 610 that substantially surrounds the portions of the lead-frame, formed form the lead-frame sheet 202, which correspond to a first electrode 612 and a second electrode 614. As an example, one of the electrodes 612 and 614 can correspond to a ground pad and the other one of the electrodes 612 and 614 can correspond to a lead (or multiple leads, as dictating the laser-cutting tool 404). The packaging material 610 also surrounds an IC die 616 that can be directly conductively coupled to the second electrode 614, and is conductively coupled to the first electrode 612 via a conductive coupling wire 618. The outer periphery of the packaging material 610 can thus be formed during the singulation of the IC package block 402 via the laser-cutting tool 404. In the example of FIG. 6, the first and second electrodes 612 and 614 are electrically isolated via a groove 620. As an example, the groove 620 can be formed by the laser-cutting tool 404, such that the first and second electrodes 612 and 614 can both initially be part of the laser-cut lead-frame sheet 202, and can be separated by the laser-cutting tool 404 to electrically isolate the respective portions of the conductive metal of the resultant lead-frame.

Figure 7:
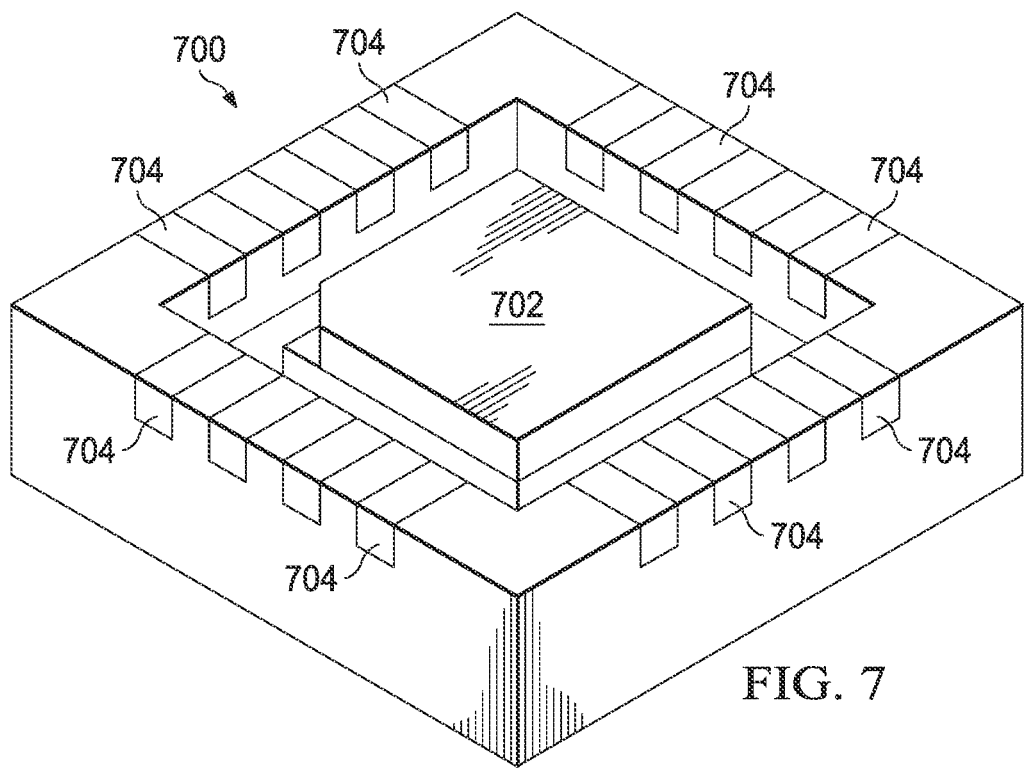
FIG. 7 is an example of an IC package.

FIG. 7 is an example of a plan view of an IC package 700. The IC package 700 can correspond to another example of a QFN IC package. The IC package 700 includes a ground pad 702 and a plurality of leads 704 that are arranged along the periphery of the IC package 700. The ground pad 702 and the leads 704 can be electrically isolated via a groove that substantially surrounds the ground pad 702.

Figure 8:
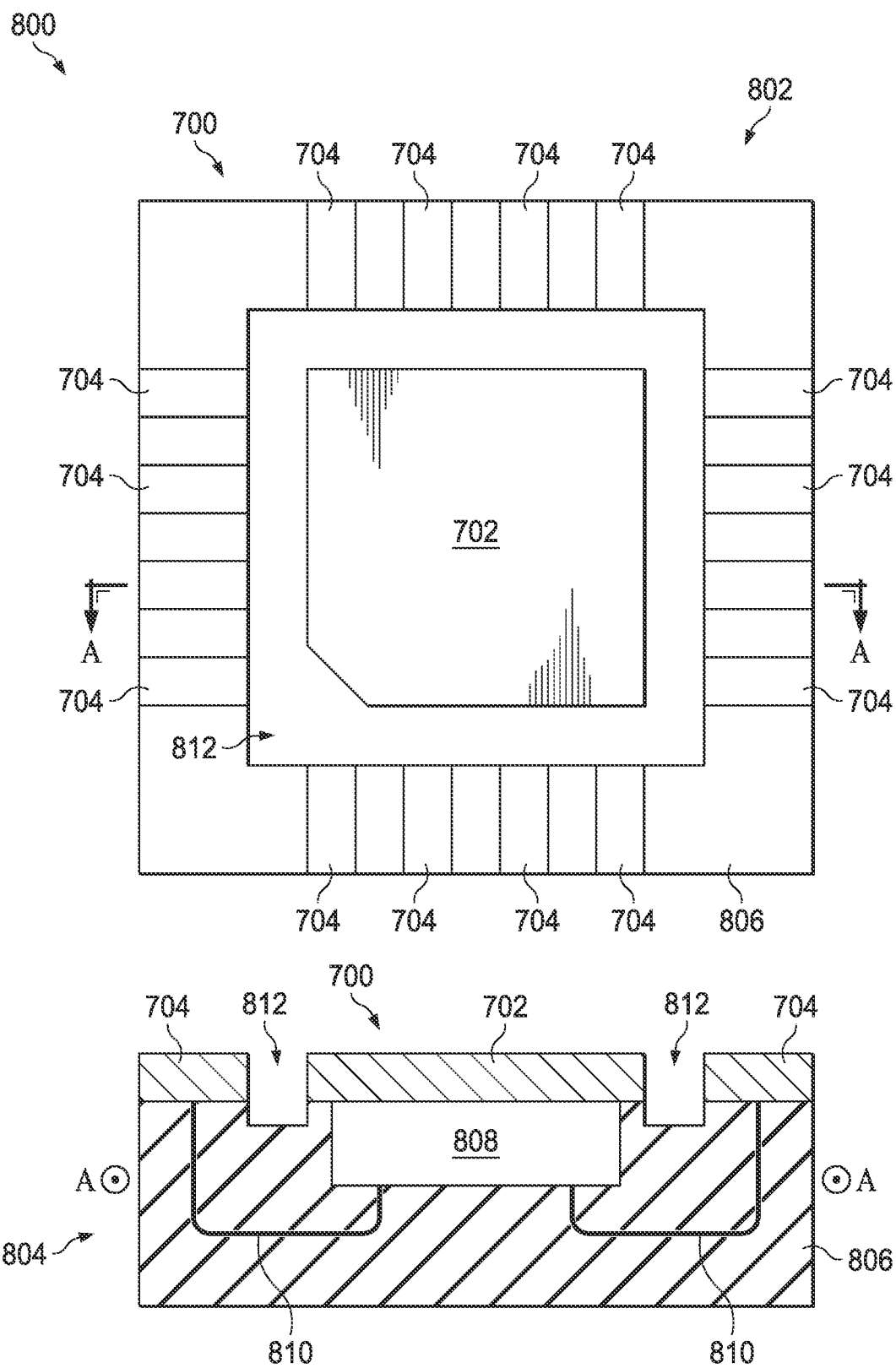
FIG. 8 is another example diagram of an IC package.

FIG. 8 is another example diagram 800 of the IC package 700. The diagram 800 demonstrates two views of the IC package 700, including a first view 802 along an XY-plane of the IC package 700 and a second view 804 of the IC package 700 corresponding to a cross-sectional view taken along "A" in the first view 802. Similar to as described above, the IC package 700 can be formed from singulating IC packages in an IC package block via the laser-cutting tool 404. As an example, the IC package 700 corresponds to a QFN IC package, with the first view 802 corresponding to a view of the bottom of the IC package 700.

The IC package 700 includes packaging material 806 that substantially surrounds the portions of the lead-frame that correspond to the ground pad 702 and the leads 704. The packaging material 806 also surrounds an IC die 808 that is directly conductively coupled to the ground pad 702, and is conductively coupled to each of the leads 704 via conductive coupling wires 810. The outer periphery of the packaging material 806 can thus be formed during the singulation of a respective IC package block via the laser-cutting tool 404. In the example of FIG. 8, the ground plane 702 and the leads 704 are electrically isolated via a groove 812. As an example, the groove 812 can be formed by the laser-cutting tool 404, such that ground plane 702 and the leads 704 can both initially be part of the laser-cut lead-frame sheet 202, and can be separated by the laser-cutting tool 404 to electrically isolate the respective portions of the conductive metal of the resultant lead-frame.

As an example, prior to forming the groove 812, the IC package 700 (e.g., before or after singulation) can undergo an electrolytic plating process to deposit a corrosion-resistant material (e.g., Tin (Sn)) on the exposed portions of the lead-frame or lead-frame sheet 202 (e.g., external to the packaging material 610, such as the ground pad 702 and the plurality of leads 704). The electrolytic plating can substantially mitigate oxidization and/or corrosion of the material (e.g., Copper) that forms the lead-frame sheet 202, and can also enable the IC package 700 to be mounted on a corresponding printed circuit board (PCB) by an end user of the IC package 700 (e.g., using a surface mount technology (SMT) process). Such an electrolytic plating process can be more cost effective than plating the entire conductive metal sheet with other materials (e.g., Nickel/Palladium/Gold) prior to laser-cutting the conductive metal material sheet 204 into the lead-frame sheet 202, particularly when part of the plating is removed and wasted by forming the groove 812.

Figure 9:
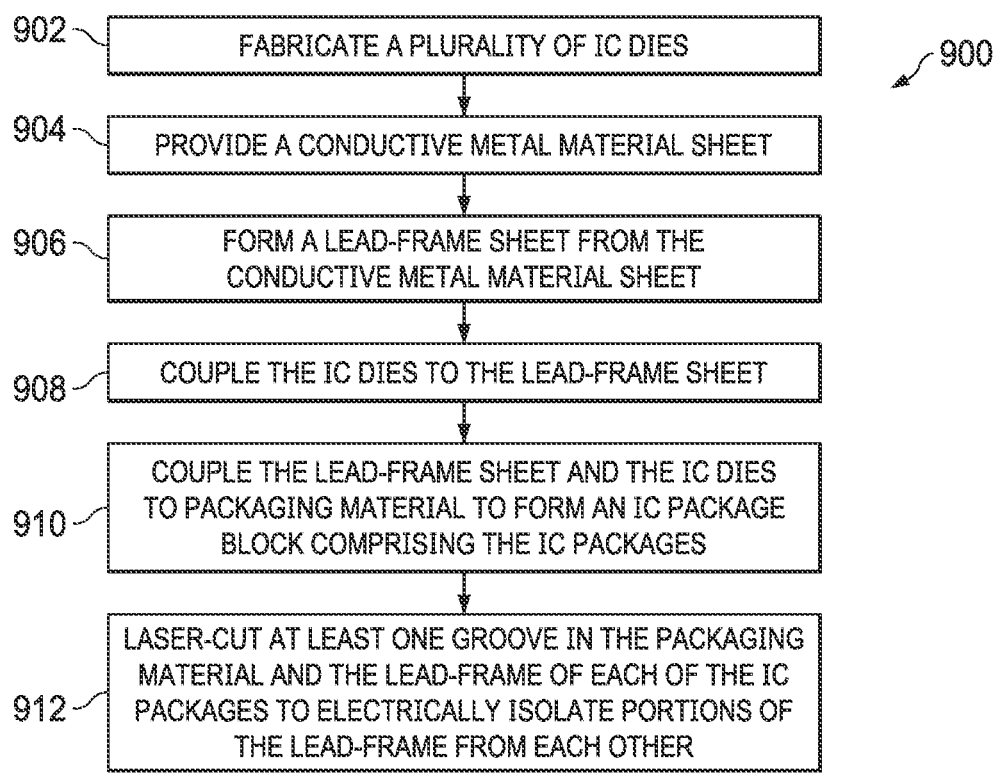
FIG. 9 is an example of a method for fabricating IC packages.

In view of the foregoing structural and functional features described above, a methodology in accordance with various aspects of the present invention will be better appreciated with reference to FIG. 9. While, for purposes of simplicity of explanation, the methodology of FIG. 9 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 9 is an example of a method 900 for fabricating IC packages (e.g., the IC packages 602 or 700). At 902, a plurality of IC dies (e.g., the IC dies 104) are fabricated. At 904, a conductive metal material sheet (e.g., the conductive metal material sheet 204) is provided. At 906, a lead-frame sheet (e.g., the lead-frame sheet 108) is formed from the conductive metal material sheet. At 908, the IC dies are coupled to the lead-frame sheet. At 910, the lead-frame sheet and the IC dies are coupled to packaging material (e.g., the packaging material 302 to form an IC package block (e.g., the IC package block 300) comprising the IC packages. At 912, at least one groove (e.g., the grooves 620 or 812) is laser-cut in the packaging material and the lead-frame sheet of each of the IC packages to electrically isolate portions of the lead-frame sheet from each other.

In this description, the term "couple" may cover connections, communications, or signal paths that enable a functional relationship consistent with this description. For example, if device A generates a signal to control device B to perform an action, then: (a) in a first example, device A is directly coupled to device B; or (b) in a second example, device A is indirectly coupled to device B through intervening component C if intervening component C does not substantially alter the functional relationship between device A and device B, so device B is controlled by device A via the control signal generated by device A.

Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device described herein as including certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor wafer and/or integrated circuit (IC) package) and may be configured to couple to at least some of the passive elements and/or the sources to form the described structure, either at a time of manufacture or after a time of manufacture, such as by an end user and/or a third party.

Modifications are possible in the described embodiments, and other embodiments are possible, within the scope of the claims.

What is claimed is:

1. A method for fabricating integrated circuit (IC) packages, the method comprising:
   fabricating a plurality of IC dies;
   providing a conductive metal material sheet;
   laser-cutting the conductive metal material sheet to form a lead-frame sheet, the lead-frame sheet comprising at least one of through-holes and three-dimensional locking features;
   coupling the IC dies to the lead-frame sheet; and
   coupling the lead-frame sheet and the IC dies to packaging material to form an IC package block comprising the IC packages.

2. The method of claim 1, further comprising laser-cutting the IC package block to singulate the IC packages.

3. The method of claim 1, further comprising laser-cutting at least one groove in the packaging material and a respective lead-frame of each of the IC packages to electrically isolate portions of the lead-frame from each other.

4. The method of claim 3, wherein laser-cutting the at least one groove comprises separating portions of the lead-frame sheet associated with leads from a portion of the lead-frame sheet associated with a ground pad via the at least one groove in each of the IC packages.

5. The method of claim 1, wherein coupling the lead-frame sheet and the IC dies to the packaging material comprises coupling the lead-frame sheet and the IC dies to the packaging material to form the IC packages as quad flat no-lead (QFN) IC packages.

6. The method of claim 1, wherein laser-cutting the conductive metal material sheet comprises laser-cutting the conductive metal material sheet to form the three-dimensional locking features of the lead-frame sheet as removing a portion of the thickness of the conductive metal material to facilitate coupling of the lead-frame sheet with the packaging material.

7. The method of claim 6, wherein coupling the lead-frame sheet and the IC dies to the packaging material comprises mating the three-dimensional locking features of the lead-frame sheet to the mating holes of the packaging material.

8. The method of claim 1, wherein laser-cutting the conductive metal material sheet comprises laser-cutting the conductive metal material sheet to form at least one of an index through-hole, a mold-flow vent feature, and a stress-release feature associated with the lead-frame sheet.

9. A method for fabricating integrated circuit (IC) packages, the method comprising:
   fabricating a plurality of IC dies;
   providing a conductive metal material sheet;
   forming a lead-frame sheet from the conductive metal material sheet;
   coupling the IC dies to the lead-frame sheet;
   coupling the lead-frame sheet and the IC dies to packaging material to form an IC package block comprising the IC packages; and
   laser-cutting at least one groove in the packaging material and a respective lead-frame of each of the IC packages to electrically isolate portions of the lead-frame from each other.

10. The method of claim 9, wherein laser-cutting the at least one groove comprises separating portions of the lead-frame sheet associated with leads from a portion of the lead-frame sheet associated with a ground pad via the at least one groove in each of the IC packages.

11. The method of claim 9, further comprising implementing an electrolytic plating process to deposit a corrosion-resistant material on an exposed portion of the lead-frame sheet after coupling the lead-frame sheet to the packaging material prior to laser-cutting the at least one groove in the lead-frame sheet of each of the IC packages.

12. The method of claim 9, wherein forming the lead-frame sheet comprising laser-cutting the conductive metal material sheet to form the lead-frame sheet, the lead-frame sheet comprising at least one of through-holes and three-dimensional locking features.

13. The method of claim 12, wherein laser-cutting the conductive metal material sheet comprises laser-cutting the conductive metal material sheet to form the three-dimensional locking features of the lead-frame sheet as removing a portion of the thickness of the conductive metal material to facilitate coupling of the lead-frame sheet with the packaging material.

14. The method of claim 9, further comprising laser-cutting the IC package block to singulate the IC packages.

15. The method of claim 9, wherein coupling the lead-frame sheet and the IC dies to the packaging material comprises coupling the lead-frame sheet and the semiconductor wafer to the packaging material to form the IC packages as quad flat no-lead (QFN) IC packages.

16. An integrated circuit (IC) package comprising:
an IC;
a lead-frame having rectangular or square through-holes; and
packaging material that substantially surrounds the IC and a portion of the lead-frame.

17. The package of claim 16, further comprising three-dimensional locking features on a side of the lead-frame facing away from the IC.

18. The package of claim 16, wherein the IC package is arranged as a quad flat no-lead (QFN) IC package.

19. The package of claim 16, wherein the lead-frame is formed in a checker-board pattern.

20. The package of claim 16, wherein the packaging material does not cover a side of the locking features facing away from the IC.

* * * * *